United States Patent
Ukraintsev

(10) Patent No.: US 7,921,465 B2
(45) Date of Patent: Apr. 5, 2011

(54) NANOTIP REPAIR AND CHARACTERIZATION USING FIELD ION MICROSCOPY

(75) Inventor: Vladimir Ukraintsev, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 443 days.

(21) Appl. No.: 12/191,855

(22) Filed: Aug. 14, 2008

(65) Prior Publication Data

US 2010/0038536 A1    Feb. 18, 2010

(51) Int. Cl.
*G01Q 40/00* (2010.01)
(52) U.S. Cl. ................. 850/19; 850/40; 850/52; 850/56; 850/57
(58) Field of Classification Search .................. 250/306, 250/307, 492.1, 492.3; 850/19, 40, 52, 56, 850/57
See application file for complete search history.

(56) References Cited

U.S. PATENT DOCUMENTS 5,151,594 A * 9/1992 McClelland ...................... 850/9
2007/0025907 A1 2/2007 Rezeq et al.
* cited by examiner

*Primary Examiner* — Robert Kim
*Assistant Examiner* — Michael Maskell
(74) *Attorney, Agent, or Firm* — Wade J. Brady, III; Frederick J. Telecky, Jr

(57) ABSTRACT

A system (100) for characterizing surfaces can include a nanotip microscope (104) in a first pressure envelope (102) at a first pressure with an electrically conductive nanotip (110) mounted thereon for characterizing a sample surface. The system can also include an ion imaging system (122, 124, 128) within a second pressure envelope (120) at a second pressure. The second pressure can less than or equal to the first pressure and the pressure envelopes (102, 120) can be separated by a pressure limiting aperture (PLA) (132). The system can further include gas sources (116, 118) for introducing into the first pressure envelope (102) at least one gas, and a voltage supply (114) coupled to the nanotip (110) for generating an electric field between the nanotip (114) and the PLA (132). In the system, the electric field repels and ionizes molecules or atoms of the gas in proximity to the nanotip (110) and the ion imaging system (122, 124, 128) collects at least a portion the repelled and ionized molecules or atoms traversing the PLA (132) to image the nanotip (110).

20 Claims, 3 Drawing Sheets

NANOTIP REPAIR AND CHARACTERIZATION USING FIELD ION MICROSCOPY

FIELD OF THE INVENTION

The present invention is directed to nanotip microscopy and more particularly, to repair and characterization of nanotips using field ion microscopy techniques.

BACKGROUND

The atomic force microscope (AFM) or scanning force microscope (SFM) is a very high-resolution type of scanning probe microscope, with demonstrated resolution of less than one nanometer, more than 1,000 times better than the diffraction limit of optical microscopy. An AFM typically consists of a microscale cantilever with a sharp tip (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. Depending on the situation, forces that are measured in AFM include mechanical contact forces or Van der Waals forces, capillary forces, chemical bonding, electrostatic forces, magnetic forces, Casimir forces, and salvation forces.

Generally, atomic sharpness of probe's apex is required to achieve needed nanometer resolution using the AFM. Nanometer resolution is typically needed for surface roughness measurements and accurate gate critical dimension (CD) and sidewall profile metrology for advanced semiconductor devices. Typically, flared Si and so-called "tripod" probes can be used by the CD AFM. However, such probes generally have a radius of apex curvature equal or exceeding 5 nm, placing a limit on CD AFM resolution. Various sharp ridge AFM probe characterizers typically have the same problem, a radius of curvature of about 5 nm. One method to provide atomically sharp AFM probes has been to place the probes in an Field Emission/Ion Microscope (FIM) to characterize and sharpen existing probe tips prior to their installation in the AFM.

However, even when atomically sharp AFM probes are provided, their continued use can result in wear or contamination of the probe tip, resulting in loss of resolution. Additionally, the sharpened AFM probes can inadvertently come into unwanted contact with a sample surface during probing or calibration, also resulting in damage and/or contamination. In either case, the probe tip can become inadequate for providing useful AFM images. Consequently, AFM probe tips are typically considered disposable, resulting in increased costs of operation for the AFM. Additionally, because AFM probes typically need to be replaced frequently, an AFM can be frequently offline for replacement and recalibration of the AFM with the new probe. Therefore, there exists a need for improving the lifetime of AFM probes.

SUMMARY

This Summary is provided to comply with 37 C.F.R. §1.73, presenting a summary of the invention briefly indicating the nature and substance of the invention. It is submitted with the understanding that it will not be used to interpret or limit the scope or meaning of the claims.

In a first embodiment of the present invention, a system for characterizing surfaces is provided. The system can include a nanotip microscope in a disposed in a first pressure envelope at a first pressure and having at least one electrically conductive nanotip mounted thereon for characterizing a sample surface. The system can further include an ion imaging system disposed within a second pressure envelope at a second pressure less than or equal to the first pressure. The first and the second pressure envelopes can be separated by at least one pressure limiting aperture (PLA). The system can also include at least one gas source for introducing into the first pressure envelope at least one gas, and a voltage supply coupled to the nanotip for generating a electric field between the nanotip and the PLA. In the system, the electric field can repel and ionize molecules or atoms of the gas in proximity to the nanotip. The ion imaging system can collect at least a portion of these repelled and ionized molecules or atoms traversing the PLA to image the nanotip.

In a second embodiment of the present invention, a method for characterizing surfaces is provided. The method can include characterizing a surface using a nanotip microscope in a disposed in a first pressure envelope at a first pressure, where the microscope has at least one electrically conductive nanotip mounted thereon for characterizing a sample surface. The method can further include introducing into the first pressure envelope at least one gas and biasing the nanotip to produce an electric field for ionizing and repelling molecules or atoms of the gas. The method can also include ion imaging the nanotip by collecting at least a portion of the repelled and ionized molecules or atoms using an ion imaging system disposed within a second pressure envelope at a second pressure, the second pressure less than or equal to the first pressure. In the method, the first and the second pressure envelopes can be separated by at least one pressure limiting aperture (PLA) and the repelled and ionized molecules or atoms used for imaging the nanotip traverse the PLA.

In a third embodiment of the present invention, a system for characterizing surfaces is also provided. The system can include a nanotip microscope in a disposed in a first pressure envelope at a first pressure. The microscope can have at least one electrically conductive nanotip mounted thereon for characterizing a sample surface and a manipulator for repositioning the nanotip in the first pressure envelope. The system can also include an ion imaging system disposed within a second pressure envelope at a second pressure, the second pressure less than or equal to the first pressure, where the pressure envelopes are separated by at least one electrically conductive pressure limiting aperture (PLA). The nanotip manipulator can be configured for placing the nanotip in a low pressure region generated by the PLA in the first pressure envelope. The system can further include at least one gas source for introducing into the first pressure envelope at least one gas in proximity to the PLA, and a voltage supply coupled to the nanotip and the electrically conductive PLA for generating a electric field between the nanotip and the PLA, where the electric field repels and ionizes molecules or atoms of the gas in proximity to the nanotip. Furthermore, the ion imaging system can collect at least a portion the repelled and ionized molecules or atoms traversing the PLA to image the nanotip.

DETAILED DESCRIPTION OF THE DRAWINGS

Figure 1:
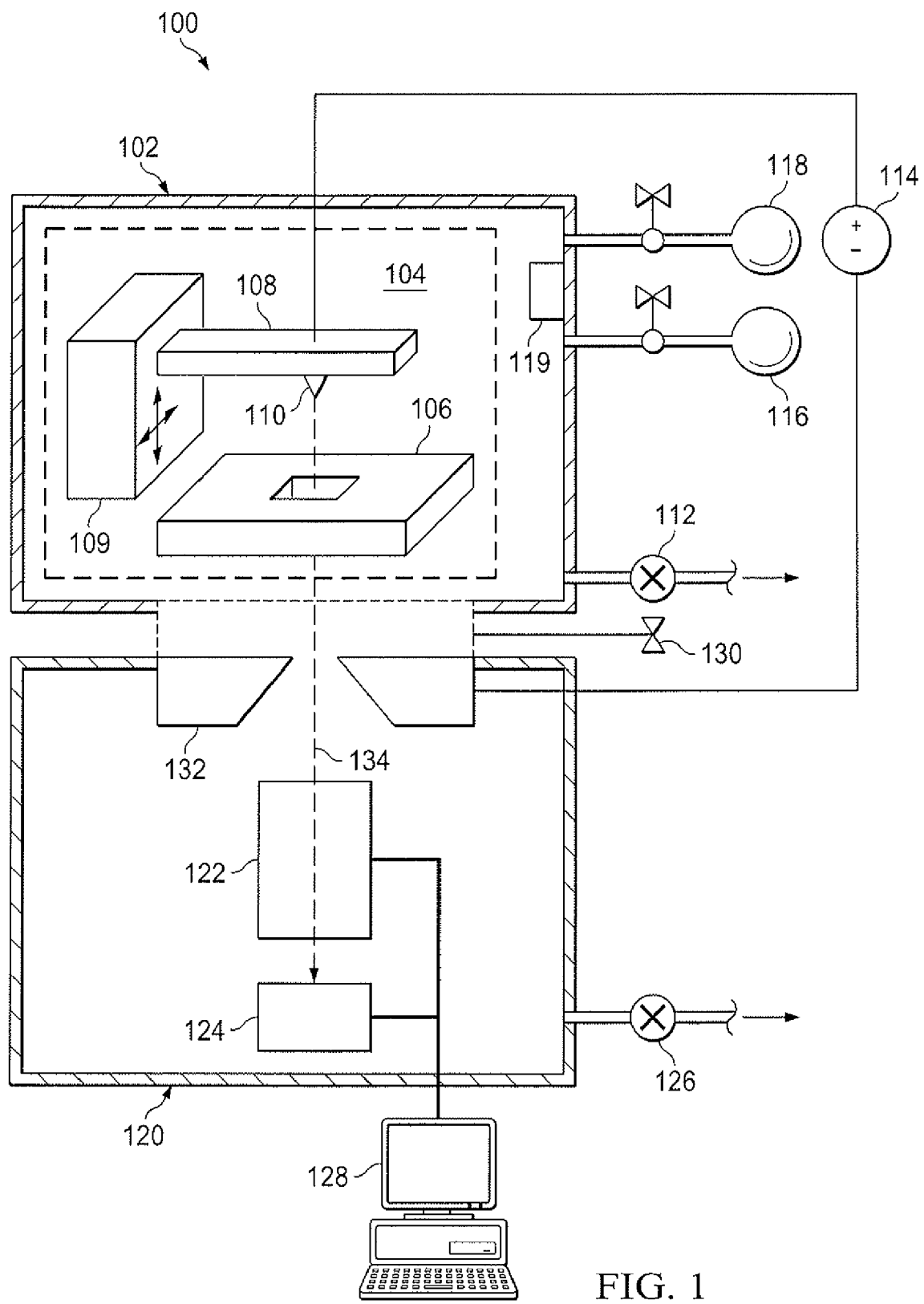
FIG. 1 is a schematic view of an exemplary system that includes a nanotip microscope device according to an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention provides systems and methods for extending lifetimes of nanotips in a nanotip microscopy systems used for characterizing surfaces. As described above, conventional nanotip microscopy devices (e.g., AFM) typically require frequent changes of the nanotip in order to ensure sufficient resolution can be provided in acquired images. To overcome these limitations and to improve throughput of the nanotip microscopy system, embodiments of the present invention also provide systems and methods that allow a damaged or contaminated nanotip to be reconditioned in situ. Furthermore, embodiments of the present invention provide analyzing a nanotip surface in situ using ion imaging techniques. In particular embodiments, the present invention provides a nanotip microscopy system operable in a field evaporization mode in order effect the removal of nanotip material or contaminant material in situ and image the nanotip in situ, to evaluate the quality or condition of the nanotip.

An exemplary system 100 according to an embodiment of the present invention is illustrated in FIG. 1. As shown in FIG. 1, the system 100 can include a sample chamber or envelope 102. The sample chamber 102 can include a nanotip microscope 104, which can include a sample platform 106 configured to operate with a nanotip probe 108 having a nanotip 110. In some embodiments, the nanotip probe 108 can comprise an atomic force microscope (AFM) probe having a nanotip attached or formed thereon. However, embodiments of the invention are not limited in this regard and a nanotip probe 108 can be configured to operate with other types of microscopy systems having nanotips, including, but not limited to, scanning tunneling microscopy (STM), scanning force microscopy (SFM), and field emission scanning electron microscopy (SEM).

In the various embodiments of the present invention the microscopy system can be configured to allow the nanotip 110 to additionally operate in a field evaporization mode to allow sharpening and/or reconditioning of the nanotip 110. For cleaning purposes, a reactant gas can be introduced that when ionized, is reactive with the contaminants on the nanotip. For example, in the case of most polymer comprising contaminants, oxygen can be introduced into the chamber 102 and ionized to recondition the nanotip 110.

Therefore, one aspect of the present invention provides for configuring the microscopy chamber to allow the introduction of conditioning gases when the nanotip is biased. That is, allowing the introduction of gases that naturally, or when ionized, are known to chemically react with the surface of the nanotip. Etchant molecules can also include molecular fragments, either neutral or charged and other possibly other charged species. These particular combinations are presented by way of example and not by way of limitation. It is within the scope of the present invention to utilize any combination of nanotip material and reactant gases.

For sharpening purposes, the nanotip 110 can be operated in a field diffusion mode to cause the diffusion of atoms from the shank (sides) to the apex of the nanotip or in a field evaporization mode to cause or enhance the etching of the apex of the nanotip 110. Operation of the field diffusion and evaporization modes for sharpening and/or etching a nanotip can be conceptually illustrated with reference to FIGS. 2A-2C described below.

Figure 2A:
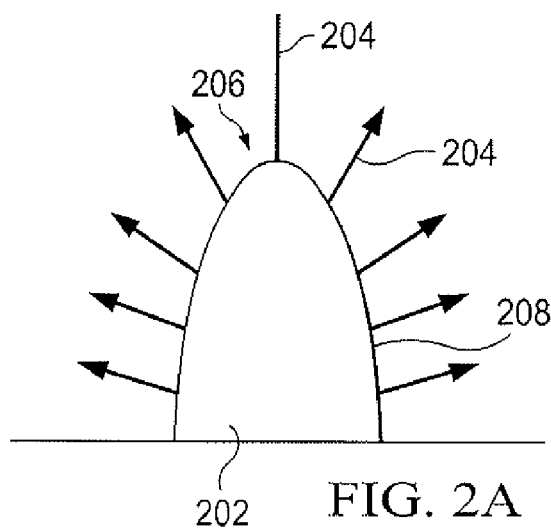
FIG. 2A conceptually shows a nanotip being biased to a field diffusion or field evaporation voltage in accordance with an embodiment of the present invention.

FIG. 2A conceptually shows a nanotip 202 comprising a shank 208 and an apex 206 being biased to a field diffusion or field evaporization voltage in accordance with an embodiment of the present invention. That is, a remote grounding plate (note shown) is biased to a voltage between 500V and 1,500V. As a result of the bias, an electric field 204 can emanate from the surfaces of the nanotip 202. Because of the small radius of the nanotip (<10 nm) relatively low biasing is needed to achieve electrical fields (3-10 V/Å) required for causing field diffusion or evaporation. Proximity to the grounding plate is not required since electrostatic potential generally drops near tip apex 206.

Figure 2B:
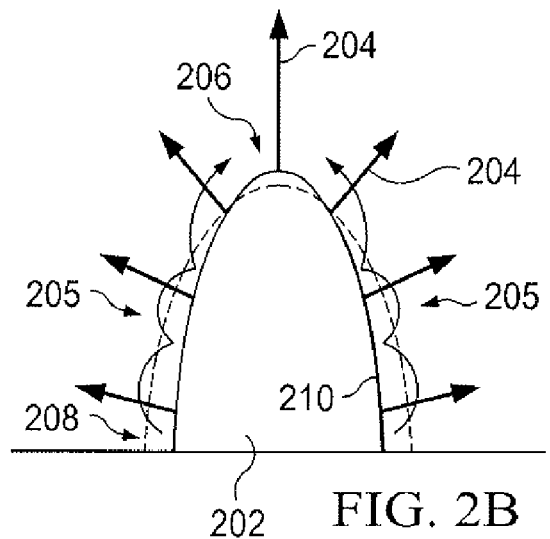
FIG. 2B conceptually shows a nanotip biased to a field diffusion or field evaporation voltage undergoing initial sharpening via diffusion in accordance with an embodiment of the present invention.

Once the electric field 204 is established, an initial sharpening of the nanotip 202 can occur via field induced diffusion, as shown in FIG. 2B. FIG. 2B conceptually shows the nanotip 202 biased to a field diffusion or field evaporization voltage undergoing initial sharpening via diffusion in accordance with an embodiment of the present invention. That is, some surface atoms or molecules having a dipole moment induced in the strong electrical field can be electrostatically transferred along the shank 208 towards the apex 206, as shown by path 205. In other words, such atoms or molecules are removed from shank 208 to the apex 206 to result in a narrowed shank 210 and an increase of the height of the apex, sharpening the nanotip 202.

Eventually, the field can induce field evaporation, in which the surface atoms are not transferred, but removed from the nanotip. In the field evaporation mode, the biased nanotip can be exposed to a reactant gas to further enhance removal of surface atoms or molecules. In some cases, a reactant gas may chemically react over the entire surface of the nanotip. In other cases, however, ionization of the gas required before etching occurs. Accordingly, the resulting electric field 204 produced by the nanotip 202 can ionize atoms or molecules in the proximity of or on the surface of the nanotip 202. Furthermore, the resulting non-uniform electric field 204 can be used to control ion-assisted surface reactions of the nanotip 202. As the field density is increased near the apex, the rate at which gas and surface atoms or molecules are ionized also increases.

Figure 2C:
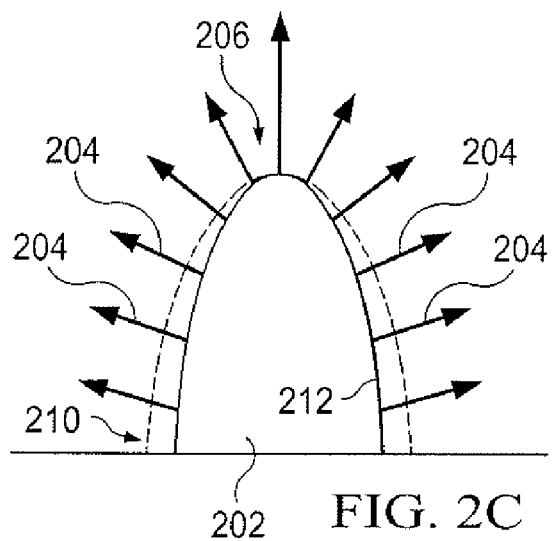
FIG. 2C is an exemplary view of a resulting nanotip after processing according to an embodiment of the present invention.

Using proper chemical reagents and plasma-surface interaction type (bombardment, etching, field-induced diffusion) higher material removal rates can be achieved on sidewall of the nanotip 202. The result is illustrated in FIG. 2C. FIG. 2C conceptually shows the nanotip 202 being sharpened due to removal of material from the nanotip 202 in accordance with an embodiment of the present invention. The resulting nanotip becomes more narrow, shown as narrowed shank 212, further effectively sharpening the probe as compared to narrowed shank 210. Similarly, the same process can be used to remove contaminants from the surface of the nanotip.

Referring back to FIG. 1, the field evaporation process in the microscopy chamber 102 can be achieved by the addition of several components. First, a voltage source 114 can be provided for generating the necessary field for the nanotip 110, as previously described. Therefore, the voltage source 114 can have one terminal coupled to the nanotip probe 108 or the nanotip 110 to bias the nanotip 110 and a second terminal coupled to a grounding plate, as described below. As previously described, the voltage source 114 can be configured to provide a voltage between 500V and 1,500V.

In some embodiments, the microscopy chamber 102 can be maintained under a vacuum to allow the introduction of etchant gases therein. Accordingly, a vacuum pumping system 112 can be coupled to the microscopy chamber 102 to remove such gases and maintain a proper pressure for reacting with the surface of the nanotip 110. In such embodiments, the vacuum pumping system 112 can be configured to permit microscopy chamber 102 to reach pressures below 10 Torr when one or more gases are introduced into the chamber 102.

Additionally, the chamber 102 can be fitted with one or more sources of reactive gases 116 and unreactive gases 118 and associated delivery hardware (valves, lines, etc., . . . ), as illustrated in FIG. 1. A "reactive" and "unreactive" gases, as used herein, refer to gases that react with a surface of a nanotip 110 being used, in either an ionized or unionized state. In some embodiments, an ionizer 119 can be added to the chamber 102 or the gas sources 116, 118 to enhance conditioning or imaging of the nanotip 110 by increasing the number of ionized gas molecules. For example, a DC, radio frequency, microwave frequency power source can be used to ionize gas atoms or molecules within the microscopy chamber 102 or prior to their introduction into the microscopy chamber.

Even though the ability to repair and recondition a nanotip, as described with reference to FIGS. 2A-2C, is advantageous from a cycle time point of view, there can still be a need to inspect the nanotip in situ to determine whether repair is necessary, whether a repair has be completed successfully, or whether the nanotip needs to be replaced. Therefore, another aspect of the present invention provides for imaging the nanotip 110 in situ to determine its condition and to decide whether to proceed with repair or replacement of the nanotip 110.

Typically, inspection of a nanotip cannot be performed in situ. Normally, the only indication an operator will have that a nanotip needs to be replaced or repaired is poor imaging results. This normally requires removal of the nanotip and inspection using an imaging tool. However, by operating a nanotip microscope in the field evaporation mode used for repairing or reconditioning, the nanotip can also imaged using ion imaging techniques. Therefore, in the various embodiments of the present invention, the nanotip 110 can be operated again in a field evaporation mode, as previously described with respect to FIGS. 2A and 2B. However, rather than using a conditioning or reactant gas, an unreactive gas can be used to generate ions for the imaging process. That is, the nanotip can be imaged using field ion microscopy techniques in situ. In particular, the unreactive gases can be adsorbed, ionized, and repelled from the surface of the nanotip 110 to generate an ion microscopy image.

The various embodiments of the present invention therefore provide for collection of these repelled ions to generate an image. However, the imaging and collection process for ion microscopy generally requires the use of a high vacuum chamber ($<10^{-3}$ Torr). Although the sample chamber 102 can be configured to operate at high vacuum, such a configuration is undesirable, as the time and/or hardware needed to reach such low pressures is cost prohibitive in a semiconductor manufacturing environment. However, the present inventor has recognized that even though a high vacuum may be needed for ion microscopy imaging, the high vacuum is needed in the ion optics chamber only and not in chamber where AFM and the nanotip are located.

Therefore another aspect of the present invention provides for configuring at least a two-pressure envelope apparatus. That is, the microscopy chamber 102 is configured to operate at a first pressure and an ion optics chamber 120 for ion microscopy imaging is provided, operating at a second and lower pressure ($<1$ mTorr), as shown in FIG. 1. The ion optics chamber 120 can include ion optics 122, an ion detector 124, and a vacuum pumping system 126. As shown in FIG. 1, the ion optics 122 and detector 124 can be coupled to a control system 128, such as a computing device, to allow for control of the ion optics 122 and to analyze ions detected by the detector 124 to generate an image of the nanotip 110. The ion optics 122, the ion detector 124, and the control system 128 can be collectively referred to as an ion imaging system 122, 124, 128.

However, because the field ionization mode for the ion microscopy requires the introduction of the unreactive gases to adsorb on the surface of the nanotip 110, the pressure in the microscopy chamber 102 will generally be higher than that allowed for the ion optics 122 to function properly. As a result, the microscopy chamber 102 and the ion optics chamber 120 are separated by a pressure limiting aperture (PLA) 132 to maintain a pressure differential between the chambers 102 and 120, regardless of the gases introduced into microscopy chamber 102. The PLA 132 can be a plate mounted between the microscopy chamber 102 and the ion optics chamber 120 and having a small size hole bored through. The hole can be on the order of less than 20 um, typically 1 to 10 um, preventing gas molecules to diffuse from one level to another through the pinhole. This allows the ion optics 122 to operate under a higher vacuum, regardless of the pressure in the microscopy chamber 102. However, during sharpening and/or reconditioning of the nanotip, an isolation valve 130 can be provided and closed to prevent any corrosive or otherwise damaging gases from reaching the ion optics 122 or ion detector 124.

In some embodiments, the PLA 132 can be constructed from electrically conductive materials, such as typical vacuum component metals, including steel, aluminum, and/or copper alloys. In such embodiments, to further enhance the propagation of ions into the ion optics chamber 120, the second terminal of the voltage source 114 can be coupled to the PLA 132. Accordingly, the PLA can be used not only to induce field diffusion and evaporation, but also as an additional ion optics.

Figure 3:
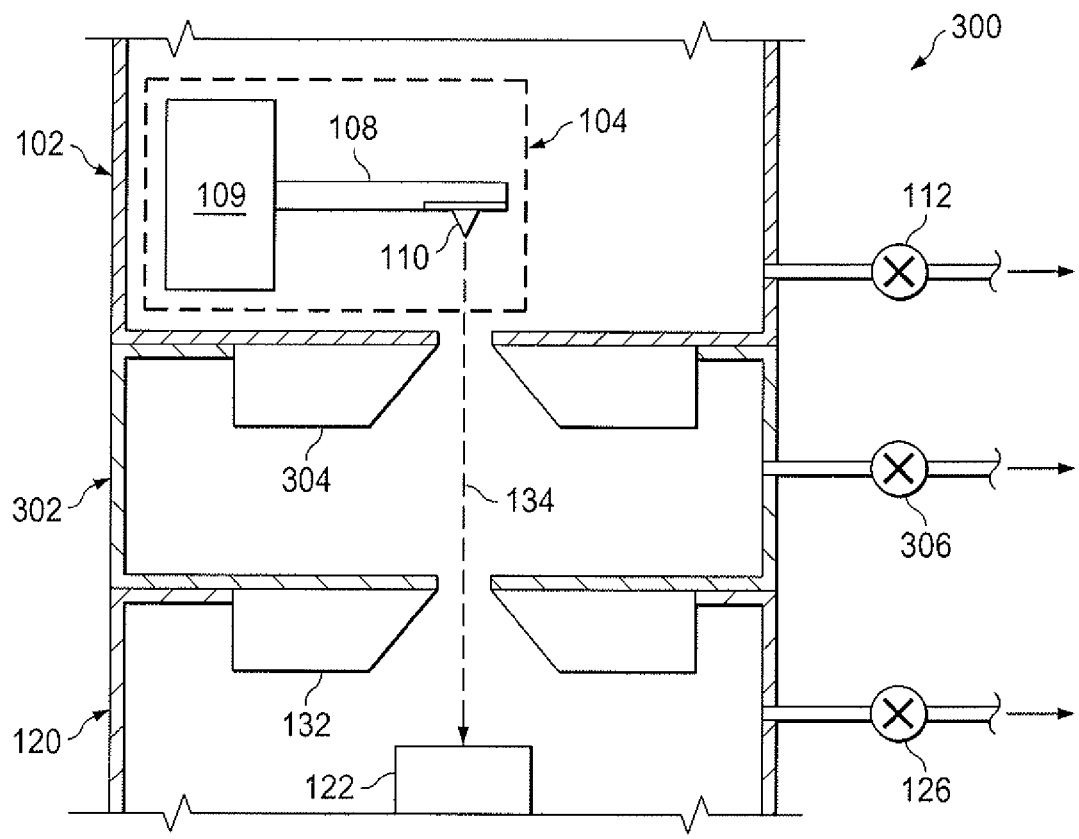
FIG. 3 is a schematic view of portion of a system including an exemplary nanotip microscope device according to another embodiment of the present invention.

In some embodiments, a single PLA may be insufficient to maintain the proper pressure in the ion optics chamber 120 during imaging. Accordingly, the microscopy chamber 102 and the ion optics chamber 120 can be separated by one or more intermediate chambers, each having a PLA and a pumping system to allow the pressure differential between the chambers 102 and 120 to be maintained. Such a system 300 is illustrated in FIG. 3. The system 300 in FIG. 3 includes an additional chamber 302 that is placed between chamber 102 and 120. Chamber 120 can be enclosed within chamber 302. The additional chamber 302 can have a separate pumping system 306 to provide an intermediate vacuum level between that of chambers 102 and 120 and an additional PLA 304 to maintain the pressure differential. Regardless of the number of chambers and PLA's used, the ion collection path 134 still needs to be maintained for proper imaging.

Figure 4:
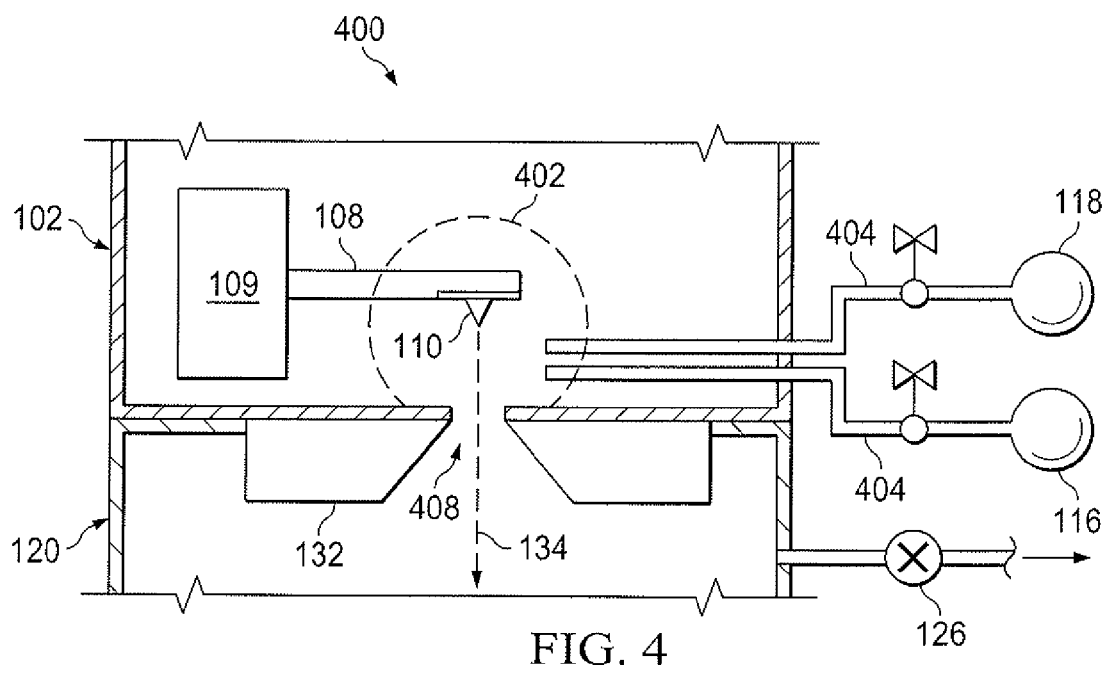
FIG. 4 is a schematic view of a portion of a system including an exemplary nanotip microscope device according to yet another embodiment of the present invention.

In some cases, it can be necessary to operate the nanotip microscope chamber 102 at higher pressures, including atmospheric pressures. In such cases, flowing of reactant or unreactive gases into the chamber 102 can be impractical and/or harmful to AFM. Accordingly, in some embodiments of the present invention, the nanotip probe 110 can be configured to reposition the nanotip 110 in the lower pressure region formed at or near the aperture of the PLA. For example, as shown in FIG. 4, partial schematic system 400 includes an exemplary nanotip microscope device according to an embodiment of the invention. System 400 comprises a manipulator 109 for the nanotip probe 110 which can be configured to position the nanotip 110 within or near to the aperture of the PLA 132. In such embodiments, the positioning of the nanotip 110 in or near the aperture of the PLA 132 results in the nanotip being placed in a low pressure region 402 formed near the aperture 408 of the PLA 132, as shown in FIG. 4. In the various embodiments of the present invention, the size of the low pressure 402 region can vary depending on radius of the aperture 408 the pressure in the microscopy chamber 102. For example, in the case of the microscopy chamber 102 being at a high pressure (>100 Torr) and an aperture 408 having a radius of less than 10 um, the low pressure region 402 will not extend significantly beyond the aperture 408. In such embodiments, the manipulator 109 would be used to position the nanotip 110 within the aperture 408. In the case of the microscopy chamber 102 being below 10 Torr, the low pressure region 402 will extend beyond the aperture 408. In such embodiments, the manipulator 109 would be used to position the nanotip 110 above the aperture 408, typically within a distance equal to the radius of the aperture 408. As the pressure in the microscopy chamber 102 is further reduced, the size of the low pressure region 402 will further increase, allowing the nanotip 110 to be positioned further from the aperture 408 of the PLA 132.

In embodiments where the nanotip 110 needs to be positioned in proximity to the aperture (within 2-3 time radius of the aperture), the reactant or unreactive gases to be used can be instead introduced at or near the aperture of the PLA 132 directly into the low pressure region 402. For example, in the case of a microscopy chamber 102 at atmospheric pressure, the nanotip 110 can be inserted into the low pressure region 402. A set of capillaries 404 can then be used to provide the reactant and/or unreactive gases required directly to the nanotip 110. In some embodiments, the nanotip probe 108 can be configured to be positioned in contact with the PLA 132 and produce a vacuum seal around the nanotip 110. Once the nanotip 110 is in this low vacuum region and receiving the appropriate gases, the cleaning and imaging modes can operate as described above.

In the various embodiments described above, ions from the nanotip 110 are directed into the ion optics 122 by placing the ion optics 122, the aperture in the PLA 132 and the nanotip 110 along the same axis defined by the ion collection path 134 as shown in FIG. 1. However, in other embodiments, such an alignment is not necessary during use of the nanotip microscope 104 for surface characterization of samples. In such embodiments, the PLA 132 and ion optics 122 can be aligned along an ion collection path 134 and the manipulator 109 can reposition the nanotip probe 108 place the nanotip 110 in the ion collection path 134. This permits the sample 102 and ion optics chambers 120 to be positioned in a variety of spatial configurations (e.g., stacked, side-by-side).

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:
1. A system for characterizing surfaces, comprising:
a nanotip microscope disposed in a first pressure envelope at a first pressure, said microscope having at least one electrically conductive nanotip mounted thereon for characterizing a sample surface;
an ion imaging system disposed within a second pressure envelope at a second pressure, said second pressure less than or equal to said first pressure, said first and said second pressure envelopes separated by at least one pressure limiting aperture (PLA);

at least one gas source for introducing into the first pressure envelope at least one gas; and a voltage supply coupled to said nanotip for generating an electric field between said nanotip and said PLA;

wherein said electric field repels and ionizes molecules or atoms of said gas in proximity to said nanotip, and wherein said ion imaging system collects at least a portion of said repelled and ionized molecules or atoms traversing said PLA to image said nanotip.

2. The system of claim 1, wherein said nanotip microscope further comprises a nanotip manipulator configured for repositioning said nanotip.

3. The system of claim 2, wherein nanotip manipulator is further configured for repositioning said nanotip in a lower pressure region generated by said PLA in said first pressure envelope.

4. The system of claim 3, wherein said gas source is configured to introduce said gas in proximity to said second pressure envelope.

5. The system of claim 1, wherein said at least one gas source comprises a plurality of gas sources for introducing at least one conditioning gas and at least one gas for producing said unreactive ionized molecules or atoms of said gas.

6. The system of claim 1, further comprising at least one other PLA between said first and said second pressure envelopes, said one PLA and said one other PLA separated by a third pressure envelope at a third pressure, said third pressure less than said first pressure and greater than said second pressure.

7. The system of claim 1, further comprising at least one gas ionizer for ionizing said gas.

8. The system of claim 1, wherein said voltage supply further biases said nanotip to ionize said gas.

9. A method for characterizing surfaces, comprising:
characterizing a surface using a nanotip microscope disposed in a first pressure envelope at a first pressure, said microscope having at least one electrically conductive nanotip mounted thereon for characterizing a sample surface;
introducing into the first pressure envelope at least one gas;
biasing said nanotip to produce an electric field for ionizing and repelling molecules or atoms of said gas; and
ion imaging said nanotip by collecting at least a portion of said repelled and ionized molecules or atoms using an ion imaging system disposed within a second pressure envelope at a second pressure, said second pressure less than or equal to said first pressure;
wherein said first and said second pressure envelopes are separated by at least one pressure limiting aperture (PLA), and where said repelled and ionized molecules or atoms used for imaging said nanotip traverse said PLA.

10. The method of claim 9, wherein said ion optics and said PLA define an ion collection path, and wherein the step of ion imaging further comprises positioning said nanotip microscope in said ion collection path.

11. The method of claim 9, wherein the step of ion imaging further comprises repositioning said nanotip in a lower pressure region generated by said PLA in said first pressure envelope.

12. The method of claim 9, wherein said gas is introduced into said first pressure envelope in proximity to said second pressure envelope.

13. The method of claim 9, further comprising:
prior to said introducing, reconditioning said nanotip with a reconditioning gas.

14. The method of claim 13, wherein said reconditioning comprises:
isolating said first and said second pressure envelopes;
introducing into the first pressure envelope at least one conditioning gas;
biasing said nanotip to repel ionized molecules or atoms of said conditioning gas; and
evacuating said conditioning gas from said first pressure envelope.

15. The method of claim 9, further comprising ionizing said gas using at least one gas ionizer in said first pressure envelope.

16. The method of claim 9, further comprising biasing said nanotip to ionize said gas.

17. A system for characterizing surfaces, comprising:
a nanotip microscope disposed in a first pressure envelope at a first pressure, said microscope having at least one electrically conductive nanotip mounted thereon for characterizing a sample surface and a manipulator for repositioning said nanotip in said first pressure envelope;
an ion imaging system disposed within a second pressure envelope at a second pressure, said second pressure less than or equal to said first pressure, said first and said second pressure envelopes separated by at least one electrically conductive pressure limiting aperture (PLA);
at least one gas source for introducing into the first pressure envelope at least one gas in proximity to said PLA; and
a voltage supply coupled to said nanotip and said electrically conductive PLA for generating an electric field between said nanotip and said PLA;
wherein said nanotip manipulator is configured to reposition said nanotip in a low pressure region generated by said PLA in said first pressure envelope, wherein said electric field repels and ionizes molecules or atoms of said gas in proximity to said nanotip, and wherein said ion imaging system collects at least a portion of said repelled and ionized molecules or atoms traversing said PLA to image said nanotip.

18. The system of claim 17, wherein said ion imaging system and said PLA define an ion collection path, and wherein said nanotip manipulator is further configured for placing said nanotip in said ion collection path.

19. The system of claim 17, further comprising a plurality of gas sources for introducing at least one conditioning gas and at least one gas for producing said unreactive ionized molecules or atoms of said gas.

20. The system of claim 17, further comprising at least one other PLA between said first and said second pressure envelopes, said one PLA and said one other PLA separated by a third pressure envelope at a third pressure, said third pressure less than said first pressure and greater than said second pressure.

* * * * *